United States Patent [19]
Yamazaki et al.

[11] Patent Number: 5,606,179
[45] Date of Patent: Feb. 25, 1997

[54] INSULATED GATE FIELD EFFECT TRANSISTOR HAVING A CRYSTALLINE CHANNEL REGION

[75] Inventors: Shunpei Yamazaki, Tokyo; Yasuhiko Takemura, Kanagawa, both of Japan

[73] Assignee: Semiconductor Energy Laboratory Co., Ltd., Kanagawa, Japan

[21] Appl. No.: 542,354

[22] Filed: Oct. 12, 1995

[30] Foreign Application Priority Data

Oct. 20, 1994 [JP] Japan ..................... 6-281409

[51] Int. Cl.[6] ............................................ H01L 29/04
[52] U.S. Cl. .......................... 257/59; 257/66; 257/69; 257/70; 257/72; 257/75
[58] Field of Search ........................ 257/58, 61, 62, 257/66, 59, 72, 69, 70, 75; 359/59, 87

[56] References Cited

U.S. PATENT DOCUMENTS

| | | | |
|---|---|---|---|
| 5,147,826 | 9/1992 | Liu et al. | 437/233 |
| 5,275,851 | 1/1994 | Fonash et al. | 427/578 |
| 5,468,987 | 11/1995 | Yamazaki et al. | 257/406 |
| 5,481,121 | 1/1996 | Zhang et al. | 257/75 |

OTHER PUBLICATIONS

C. Hayzelden et al., "In Situ Transmission Electron Microscopy Studies of Silicide–Mediated Crystallization of Amorphous Silicon" (3 pages), Oct. 1991.

A. V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640, 1986, no month.

T. Hempel et al., "Needle–Like Crystallization of Ni Doped Amorphous Silicon Thin Films", *Solid State Communications*, vol. 85, No. 11, pp. 921–924, 1993. no month.

R. Kakkad et al., "Crystallized Si films by low–temperature rapid thermal annealing of amorphous silicon," *J. Appl. Phys.*, 65(5), Mar. 1, 1989, pp. 2069–2072.

G. Liu et al., "Polycrystalline silicon thin film transistors on Corning 7059 glass substrates using short time, low–temperature processing," *Appl. Phys. Lett.* 62(20), May 17, 1993, pp. 2554–2556.

G. Liu et al., "Selective area crystallization of amorphous silicon films by low–temperature rapid thermal annealing," *Appl. Phys. Lett.* 55(7), Aug. 14, 1989, pp. 660–662.

R. Kakkad et al., "Low Temperature Selective Crystallization of Amorphous Silicon," *Journal of Non–Crystalline Solids*, 115, 1989, pp. 66–68.

*Primary Examiner*—Minhloan Tran
*Attorney, Agent, or Firm*—Sixbey, Friedman, Leedom & Ferguson, P.C.; Gerald J. Ferguson, Jr.; Bradley L. Blanche

[57] ABSTRACT

Method of fabricating edgeless staggered type thin-film transistors (TFTs) substantially without producing steps on gate electrodes. This method is effective in reducing parasitic capacitance and isolating transistors from each other. A catalyst element such as nickel is added to regions corresponding to source/drain regions of TFTs, or a layer of the catalyst element or a layer of a compound of the catalyst element is formed. An intrinsic amorphous silicon film is formed either on the regions or on the layer of the catalyst element or its compound. The laminate is thermally annealed to diffuse the catalyst element into the amorphous silicon film. The amorphous silicon film is selectively crystallized around the source/drain regions. As a result, high-resistivity regions are produced in the other regions. No channel is created. The TFTs can be isolated from each other.

11 Claims, 7 Drawing Sheets

FIG.2A  Corresponding to FIG.1B

FIG.2B  Corresponding to FIG.1B

FIG.8A  gate off

FIG.8B  gate on

INSULATED GATE FIELD EFFECT TRANSISTOR HAVING A CRYSTALLINE CHANNEL REGION

BACKGROUND OF THE INVENTION

1. Field of the Invention

The present invention relates to a crystalline semiconductor 4 and, more particularly, to a silicon semiconductor in the form of a thin film and to a semiconductor device using such a silicon semiconductor. The invention also relates to a method of fabricating them.

2. Description of the Related Art

Thin-film transistors (TFTs) used as thin-film devices are roughly classified into two categories: planar type and staggered type. Of these TFTs, staggered TFTs having shapes as shown in FIGS. 5(A)–5(E) and 6(A)–6(C) are known. These staggered TFTs are hereinafter referred to as the edgeless type.

This edgeless type TFT has an active layer in the form of an island which has substantially the same shape as the gate electrode. As a result, any steps extending across the gate electrodes do not exist. They are named edgeless type because no steps are present.

The above-described absence of steps extending across the gate electrodes is quite advantageous to TFT characteristics and to production yield. It has been often observed that steps crossing the gate electrodes (substantially at right angles to them) cause the gate electrodes to break. In the edgeless type, it is unlikely that interconnection breakage is caused by such steps.

The semiconductor characteristics at the edges of the active layer in the form of islands are deteriorated by plasma damage or for other cause Therefore, there exists a leakage current flowing across the edges. When a gate electrode of interest is unselected (i.e., in the case of the N-channel type, zero voltage or negative voltage is applied to the gate electrode), a large amount of leakage current (also known as OFF current) flows. Hence, the integrated circuit characteristics are deteriorated.

Strictly, even the edgeless type should have edges in the active layer. The source and the drain are electrically interconnected through a very long detour running along the gate electrode. In the prior art structure, the source and drain are interconnected nearly with the shortest distance. Therefore, the edgeless type is more effective in reducing OFF current than the prior art type.

In the edgeless type, steps running parallel to the gate electrodes do exist. These steps are mainly attributable to steps in source or drain. Since the steps parallel to the gate electrodes are little related to breakage of the gate electrode or to the OFF current, the TFT characteristics are affected only a little by these parallel steps.

Heretofore, the edgeless type TFT has been fabricated by the process sequence illustrated in FIGS. 5(A)–5(E). FIGS. 6(A)–6(C) are top views of the edgeless TFT illustrated in FIGS. 5(A)–5(E). First, a pair of N- or P-type amorphous or crystalline semiconductor regions 53 is formed on a glass substrate 51 directly or via a buffer layer 52 consisting of an appropriate insulator. An amorphous or crystalline intrinsic (N- or P-type impurity is not intentionally implanted) semiconductor layer 54 is formed so as to cover the semiconductor regions 53. Since the semiconductor layer 54 is made from the same material as source/drain regions 53, the semiconductor layer 54 is preferably sufficient thinner than the source/drain regions 53 so that no overetching will take place later (FIGS. 5(A) and 6(A)).

Figure 5A:
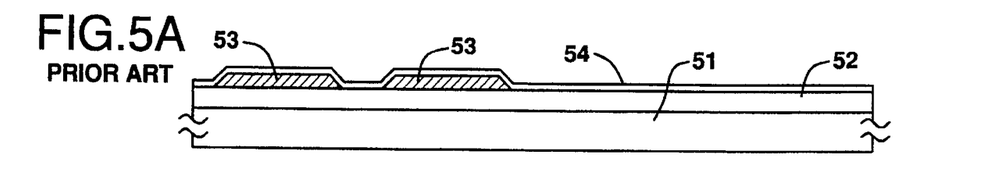
FIGS. 5(A)–5(D) are top views of the TFTs fabricated by the prior art techniques.
Figure 5B:
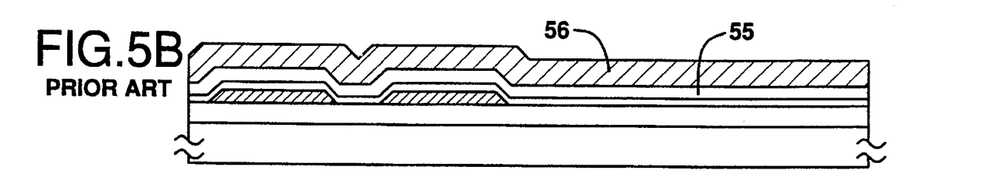
Figure 5C:
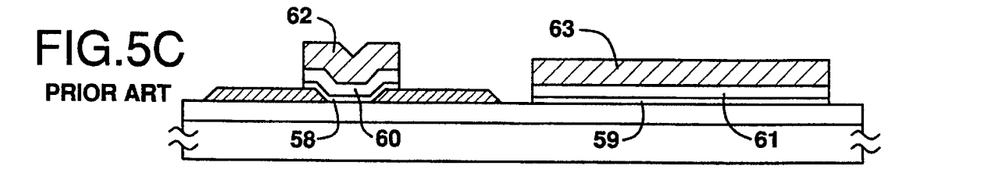
Figure 5D:
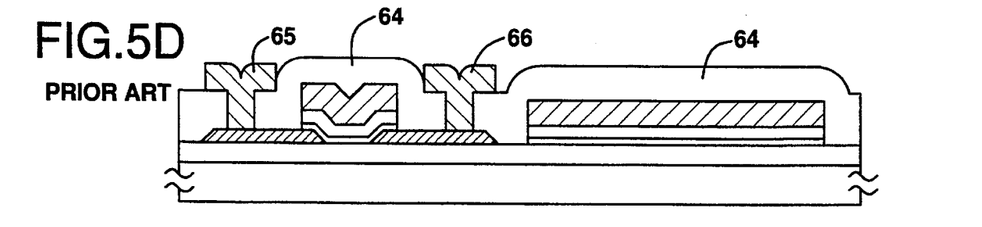
Figure 6A:
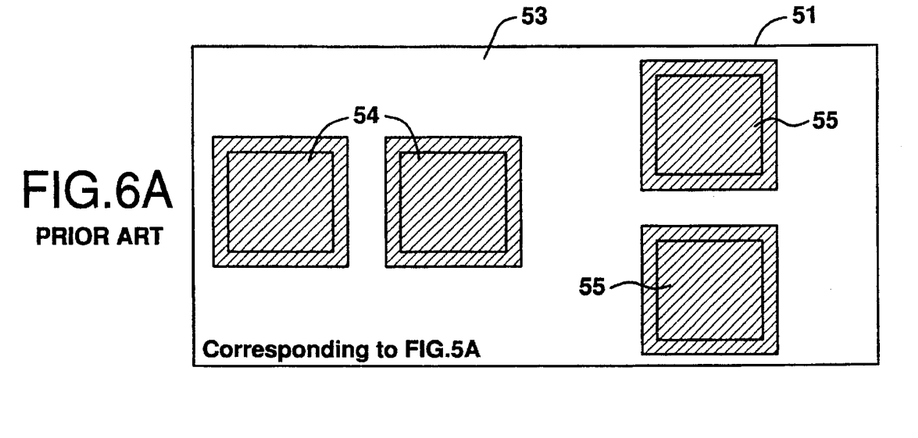
FIGS. 6(A)–6(C) are top views of the TFTs shown in FIGS. 5(A)–5(E)
Figure 6B:
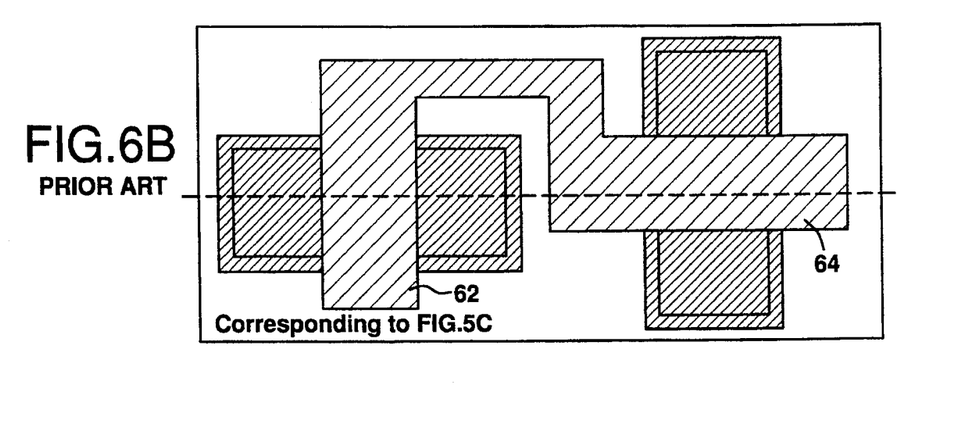
Figure 6C:
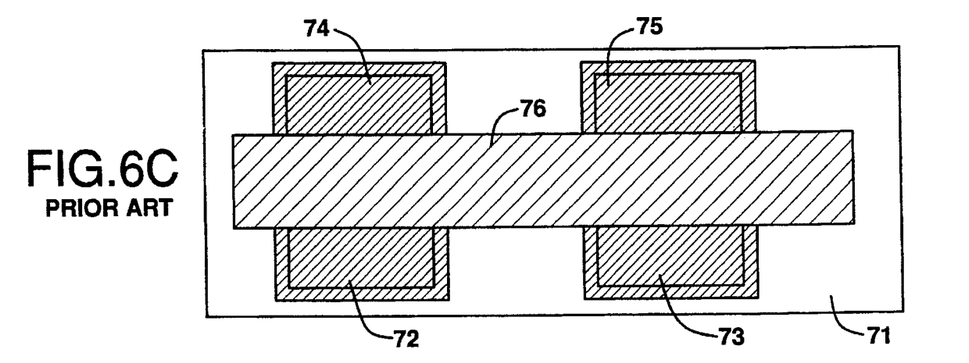

Then, a dielectric film 55 and a conductive film 56 are formed (Fig. 5(B)). The conductive film 56, the dielectric film 55, and the semiconductor layer 54 are etched to form gate electrode/interconnects 62, 63, gate-insulating films 60, 61, and semiconductor layers 58, 59. Since only one photolithography step is carried out for etching, the gate electrode/interconnects, gate-insulating film, and semiconductor layer have substantially the same shape (FIGS. 5(C) and 6(C)).

Thereafter, an interlayer insulator 64 is deposited. Contact holes are formed in the insulator 64. Source/drain electrodes/interconnects 65, 66 are formed (FIG. 5(D)). The laminate TFT structure obtained in this way assumes the state shown in FIG. 5(E).

Figure 5E:
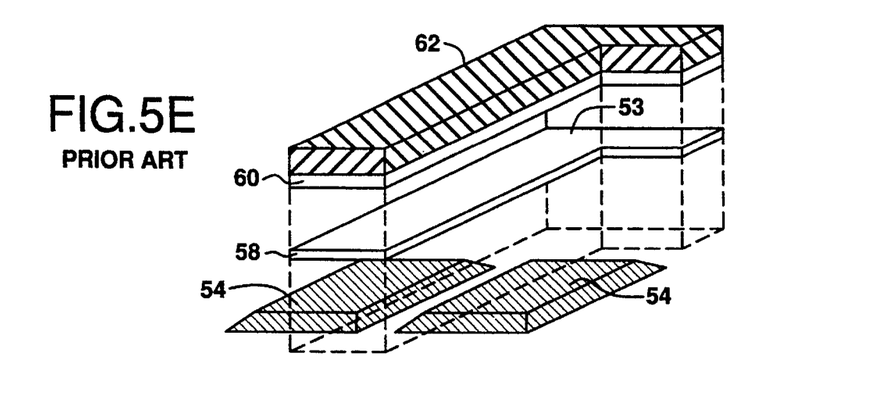
FIG. 5(E) is a perspective view of the lamination structure of the TFTs shown in FIGS. 5(A)–5(D)

As can be seen from FIG. 5(E), the semiconductor layer has substantially the same shape as the gate electrode and interconnects. Therefore, if the gate electrode is long, the semiconductor layer is elongated proportionately. The semiconductor layer is isolated from the gate interconnects only by a thin film such as a gate-insulating film. Consequently, a very great parasitic capacitance exists for the gate electrode. The result is that the operation speed of the circuit decreases. Also, the amount of electric power consumed is increased. Especially, where the semiconductor layer is made from crystalline silicon, a channel is induced more easily than in the case of amorphous silicon and so this is a serious problem. In the case of a large-area circuit such as an active matrix circuit, the problem is so serious that it is impossible to drive the circuit actually.

Furthermore, device isolation poses problems. No problem takes place if one gate electrode is provided for each one TFT. However, if one gate interconnect is formed over two or more TFTs as shown in FIG. 6(C), then a problem occurs. In this structure, if the gate electrode is turned ON, a channel is formed in the whole semiconductor layer located under the gate electrode. This is described in further detail by referring to FIG. 7(A).

Figure 7A:
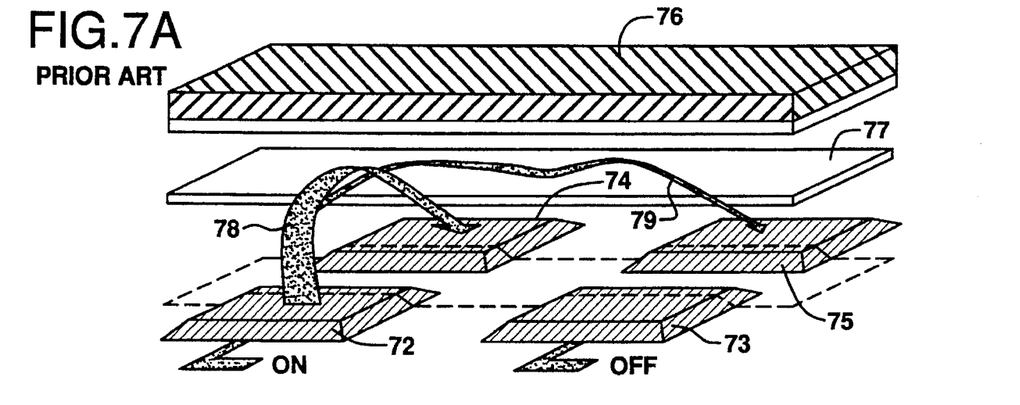
FIG. 7(A) is a perspective view of the TFT circuit fabricated by the prior art techniques, illustrating the operating principle.
Figure 7B:
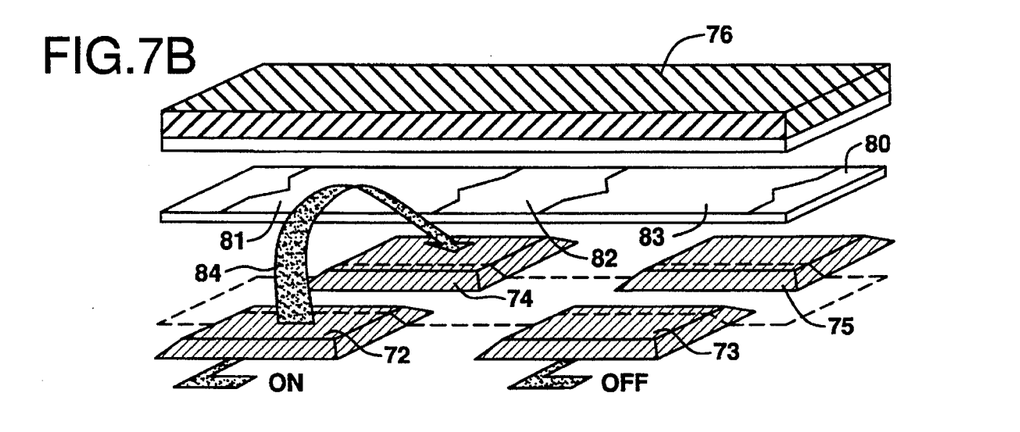
FIG. 7(B) is a perspective view of a TFT circuit according to the invention, illustrating the operating principle.

In FIGS. 7(A) and 7(B), gate electrodes of two TFTs of the construction shown in FIG. 6(C) are formed by one gate interconnect 76. When the gate interconnect 76 is turned ON, an ON signal is applied to the source 72 of the first TFT, and an OFF signal is applied to the source 73 of the second TFT. The output signal from the drain 74 of the first TFT and the output signal from the drain 75 of the second TFT are also shown in FIGS. 7(A) and 7(B).

Figure 8A:
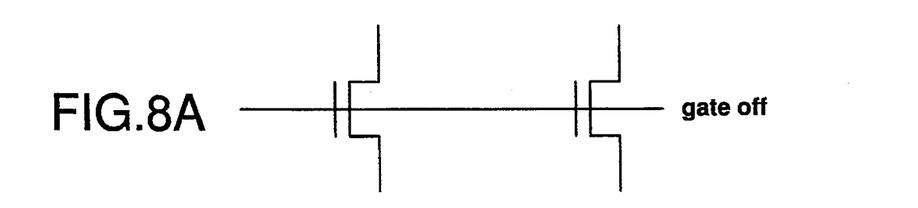
FIGS. 8(A) and 8(B) are diagrams of equivalent circuits of the TFT circuits shown in FIGS. 7(A) and 7(B), respectively.
Figure 8B:
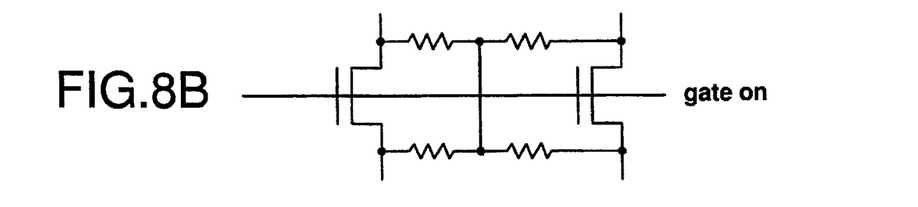
Figure 9A:
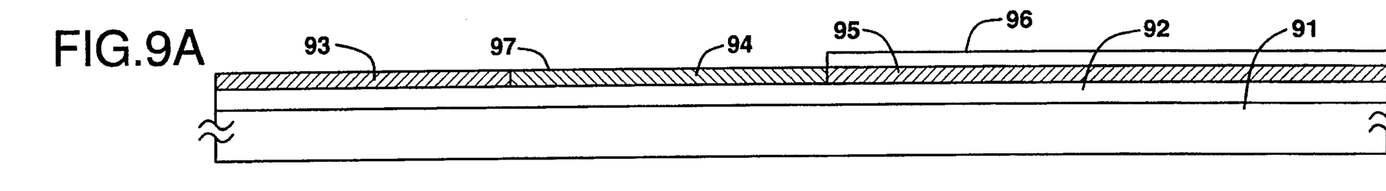
FIGS. 9(A)–9(D) are cross-sectional views illustrating the fabrication sequence of Example 3 of a method according to the invention, for fabricating TFTs.
Figure 9B:
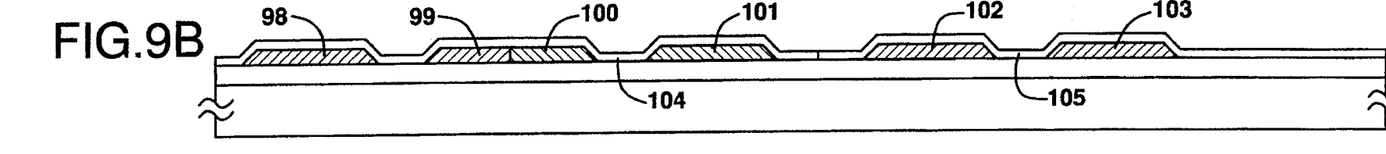
Figure 9C:
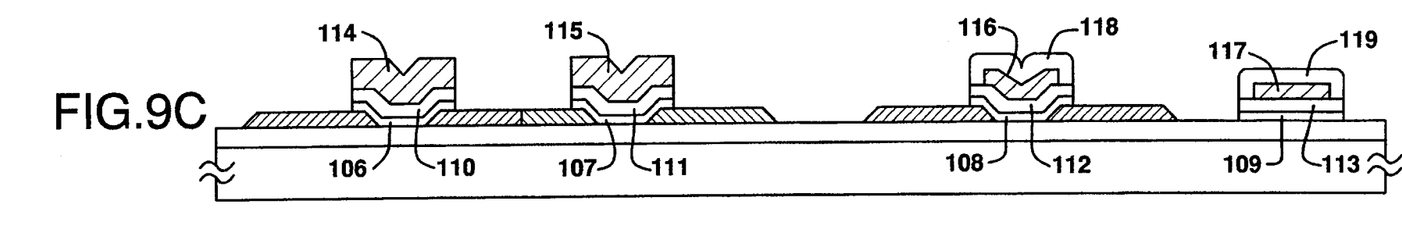
Figure 9D:
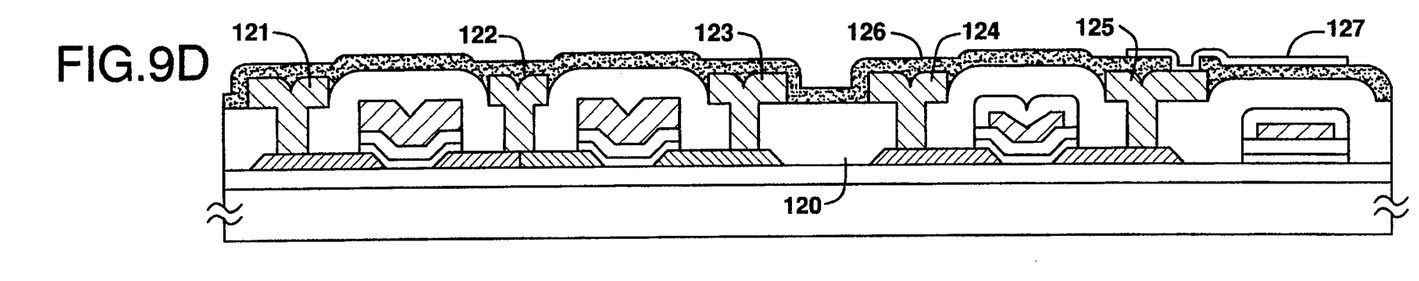

Since the gate electrode/interconnect 76 is ON, a channel is created in a semiconductor layer 77. An electric current 78 flows from the source 72 of the first TFT to the drain 74. At the same time, however, an interference current 79 flows into the drain 75 of the second TFT, because the channel is formed over the whole surface of the semiconductor layer 77. This is represented by the equivalent circuit of FIGS. 8(A) and 8(B). In FIG. 8(A), the gate electrode is OFF. At this time, no channel is created and so no drain current is produced. Of course, no interference current is produced. In FIG. 8(B), the gate electrode is ON. At this time, a drain current is produced, and a channel creates a conductive path (indicated by the symbols of resistors) to the adjacent TFT.

The interference current 79 decreases as the spacing between the first and second TFTs increases because the channel has a finite resistance as shown in FIG. 8(B). In order to provide sufficient device isolation, however, the size of each device is increased greatly. For example, if the distance between the first source and the first drain is 10 μm, then it is necessary to set the distance between the adjacent TFTs to greater than 1 mm in order to reduce the interference current by a factor of more than 100.

In order to circumvent this problem, it has been heretofore necessary that only one gate electrode/interconnect be provided for each one TFT. If it is necessary to drive the gate electrode/interconnect as one unit, the gate electrode must be connected via the top metallization layer. In this structure, however, the contact between adjacent metallization layers is increased. This reduces the production yield. In an active matrix circuit, it is necessary to use the top metallization layer as data lines. Therefore, additional conductive interconnects are needed. Alternatively, it is necessary to form those portions which are other than the portions crossing the data lines out of the same metallization layer as the data lines. In the former structure, however, the number of metallization layers is increased. This in turn increases the number of manufacturing steps. That is, the productivity decreases. In the latter structure, the contact between the adjacent metallization layers increases further, thus deteriorating the production yield. Indeed, none of these structures can be put into practical use.

SUMMARY OF THE INVENTION

In view, of the foregoing problems, it is an object of the present invention to provide a semiconductor device in which TFTs using a common gate interconnect are sufficiently isolated from each other.

The inventors of the present invention solve the foregoing problems by adding a layer containing a catalyst element such as nickel for promoting crystallization of amorphous silicon to an amorphous silicon film so that a thin film of crystalline semiconductor is formed by thermal annealing in a short time at a temperature lower than temperatures at which amorphous silicon is normally crystallized. The inventors have discovered that the crystallization can be accelerated by introducing a trace amount of nickel into the amorphous silicon film. The inventors estimate that amorphous silicon easily combines with nickel, thus producing nickel silicide, and that this reacts with the adjacent amorphous silicon as given by amorphous silicon (silicon A) + nickel silicide (silicon B)→nickel
silicide (silicon A) + crystalline silicon (silicon B)
(silicon A and silicon B indicate positions of silicon)

This reaction formula indicates that nickel spreads out while changing the amorphous silicon into crystalline silicon. In practice, it is known that the reaction is initiated below 580° C. and that the reaction is observed even at 450° C. As a result of the reaction, nickel exceeding $1\times10^{16}$/cm$^3$ remained in the silicon.

This also means that the crystallization progresses in one direction. That is, the direction of the crystallization can be controlled. Especially, where nickel moves laterally, the crystallization progresses laterally. This s referred to as the lateral growth process of nickel-added low temperature crystallization process. Elements which can be used to promote such amorphous silicon include elements belonging to group VIII of the periodic table (i.e., iron (Fe), cobalt (Co), ruthenium (Ru), rhodium (Rh), palladium (Pd), osmium (Os), iridium (Ir), platinum (Pt)), or 3d elements (i.e., scandium (Sc), vanadium (V), manganese (Mn), copper (Cu), and zinc (Zn)), gold (Au), and silver (Ag), as well as nickel (Ni).

The inventors of the present invention have found that if such an element is added, even an amorphous silicon film as thin as 300–1000 Å can be crystallized. If this film is applied to TFTs, the active layer can be thinned. In consequence, the characteristics can be improved. It is to be noted that many of the elements listed above are not preferable to silicon semiconductor. It has been revealed that the concentration of the element in the active layer of TFTs is preferably less than $1\times10^{19}$ atoms/cm$^3$.

Such an element for promoting crystallization of amorphous silicon is hereinafter referred to as a catalyst element. In the present invention, the addition of a catalyst element promotes crystallization to thereby isolate edgeless TFTs from each other. In the prior art method, this isolation has presented problems.

In the present invention, a catalyst element is contained in source/drain regions, or a layer either of a catalyst element or of its compound is formed in intimate contact with the top or bottom surface of a region which will become the source/drain regions. A substantially intrinsic amorphous silicon film which is sufficiently lightly doped with the catalyst element is formed on the layer of the catalyst element or its compound. The amorphous silicon layer is thermally annealed at an appropriate temperature for an appropriate time. As a result, the catalyst element diffuses out of the source/drain regions. The crystallization is concentrated to around the source/drain regions. At this time, the crystallization progresses parallel to the drain current between the source and the drain. This is effective in enhancing the characteristics of the TFTs.

Figure 1A:
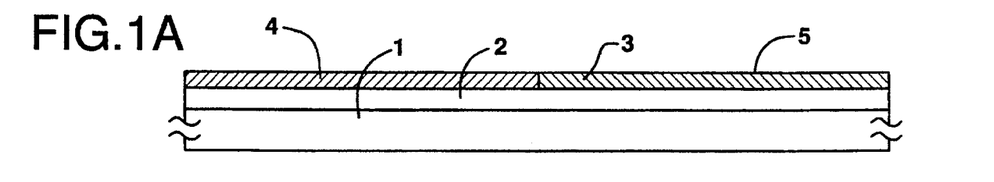
FIGS. 1(A)–1(E) are cross sections illustrating the fabrication sequence of Example 1 of a method according to the invention, for fabricating TFTs.
Figure 1B:
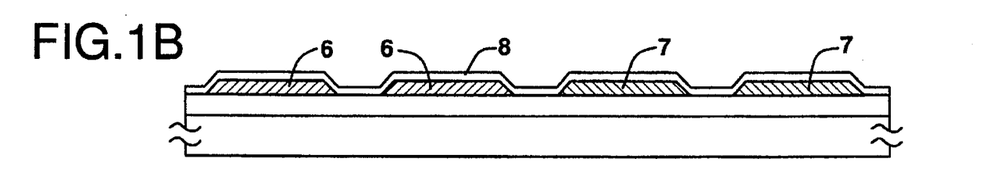
Figures 1C, 1D:
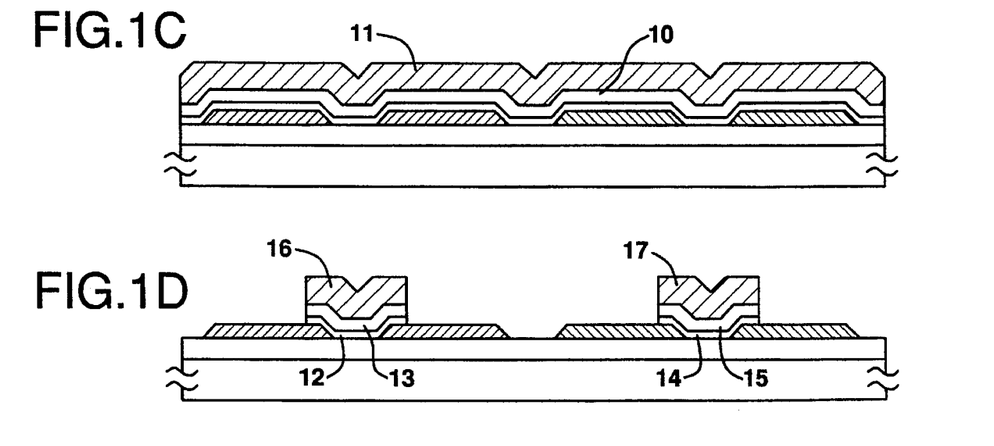
Figure 1E:
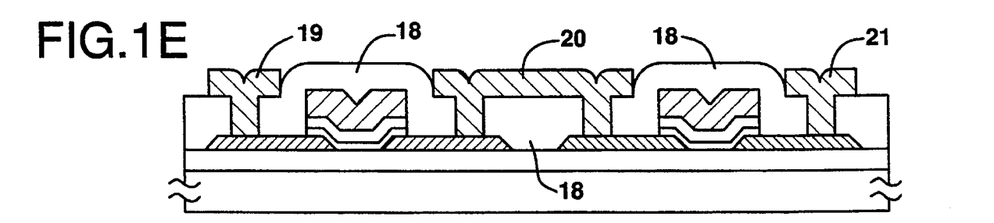
Figure 2A:
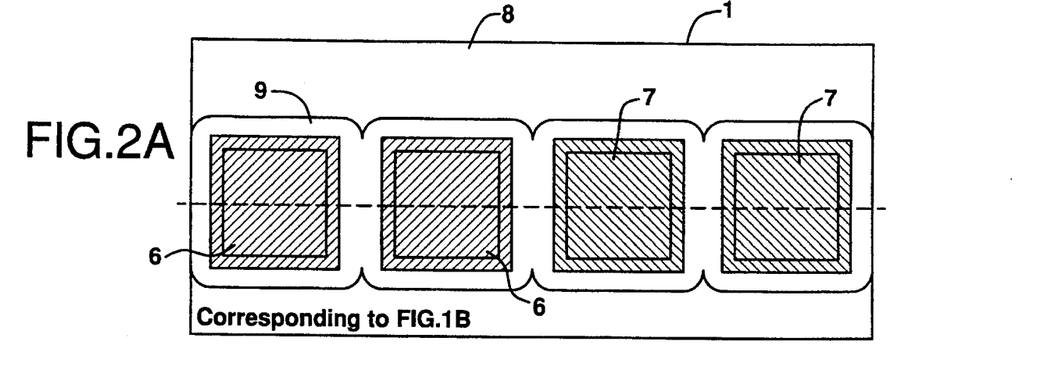
FIGS. 2(A)–2(B) are top views of the TFTs shown in FIGS. 1(A)–1(E)

The theory underlying the inventive method is now described by referring to FIGS. 1(A)14 1(E) and 2(A)–2(C). As shown in FIG. 1(B), after regions 6 and 7 containing a catalyst element and becoming source/drain regions are formed on a substrate 1 or on a buffer layer 2, a substantially intrinsic amorphous silicon film 8 is formed. The laminate is thermally annealed under appropriate conditions. As a result, as shown in FIG. 2(A), a region 9 which has been crystallized only around the sourcedrain regions is formed. The other portions remain amorphous.

Such selective crystallization is observed where the film thickness of the amorphous silicon is in excess of 1000 Å and the annealing is carried out below 580° C. However, if the annealing temperature is higher than 600° C., then crystallization is started in the entirety of the silicon film irrespective of the presence of a catalyst element. Furthermore, excessively prolonged annealing is not preferable to the selective crystallization. In this way, the semiconductor layer 8 is selectively crystallized (FIGS. 1(B) and 2(A)).

Then, a dielectric film 10 and a conductive coating 11 are deposited (FIG. 1(C)).

Thereafter, the conductive coating 11, the dielectric film 10, and the semiconductor layers 8 and 9 are etched to form gate electrode/interconnects 16, 17, gate-insulating films 13, 15, and semiconductor layers 12, 14. As a result, the gate electrode/interconnects, gate-insulating film, and semiconductor layers have substantially the same shape, in the same way as in the prior art techniques (FIGS. 1(D) and 2(B)).

However, the semiconductor layer 12 or 14 has a structure different from the structure obtained heretofore. This is described below in connection with the lamination structure of TFTs shown in FIG. 2(C). The semiconductor layer 12 contains the crystallized regions 9 and the amorphous regions 8. The effects will be described later.

Then, an interlayer insulator 18 is deposited. Contact holes are formed in this insulator 18. Source/drain electrodes/interconnects 19–20 are formed (FIG. 1(E)).

A first embodiment of the present invention is a semiconductor device comprising: a pair of semiconductor regions, each of said semiconductor regions containing an N- or P-type impurity and a catalyst element for promoting crystallization of amorphous silicon; a gate electrode formed between said semiconductor regions; a gate-insulating film which is substantially identical in shape with said gate electrode; and a substantially intrinsic semiconductor layer which is substantially identical in shape with said gate electrode, said semiconductor layer having crystalline silicon regions and amorphous silicon regions.

A second embodiment of the invention is a semiconductor device comprising: a pair of semiconductor regions, each of said semiconductor regions containing an N- or P-type impurity; a gate electrode formed between said semiconductor regions; a gate-insulating film which is substantially identical in shape with said gate electrode; and a substantially intrinsic semiconductor layer which is substantially identical in shape with said gate electrode, said semiconductor layer having a first portion located between said semiconductor regions, said first portion containing a catalyst element for promoting crystallization of amorphous silicon at a concentration of $1 \times 10^{16}$ to $1 \times 10^{19}$ atoms/cm$^3$.

A third embodiment of the invention is a semiconductor device comprising: a pair of semiconductor regions, each of said semiconductor regions containing an N- or P-type impurity; a gate electrode formed between said semiconductor regions; a gate-insulating film which is substantially identical in shape with said gate electrode; and a substantially intrinsic semiconductor layer which is substantially identical in shape with said gate electrode, said semiconductor region having a first region located between said semiconductor regions, said first region being crystallized along a line connecting said semiconductor regions.

A fourth embodiment of the invention is a semiconductor device comprising: at least two pairs of semiconductor regions, each of said semiconductor regions containing an N- or P-type impurity and a catalyst element for promoting crystallization of amorphous silicon; gate electrodes and gate interconnects for connecting said semiconductor regions; a gate-insulating film which is substantially identical in shape with said gate electrodes; a substantially intrinsic semiconductor layer which is substantially identical in shape with said gate electrodes, said semiconductor layer having at least two crystalline silicon regions; and an amorphous silicon region located between said crystalline silicon regions.

A fifth embodiment of the invention is a method of fabricating a semiconductor device, the method comprising the steps of: forming an N- or P-type silicon film on a dielectric surface; forming a layer containing a catalyst element for promoting crystallization of amorphous silicon in such a way that said layer is substantially in intimate contact with top or bottom surface of said silicon film; etching said N- or P-type silicon film and said layer containing said catalyst element to form a pair of semiconductor regions becoming source/drain regions; forming a substantially intrinsic amorphous silicon film; selectively crystallizing said amorphous silicon film by thermal annealing; forming a dielectric film; forming a conductive coating; and etching said conductive coating, said dielectric film, and said silicon film to form a gate electrode, a gate-insulating film, and a semiconductor layer.

A sixth embodiment of the invention is a method of fabricating a semiconductor device, the method comprising the steps of: forming a pair of semiconductor regions out of N- or P-type silicon on a dielectric surface, said semiconductor regions containing a catalyst element for promoting crystallization of amorphous silicon, said semiconductor regions becoming source/drain regions; forming a substantially intrinsic amorphous silicon film; selectively crystallizing said amorphous silicon film by thermal annealing; forming a dielectric film; forming a conductive coating; and etching said conductive coating, said dielectric film, and said silicon film to form a gate electrode, a gate-insulating film, and a semiconductor layer.

A seventh embodiment of the invention is a method of fabricating a semiconductor device, the method comprising the steps of: forming an N- or P-type silicon film on a dielectric surface; forming a layer containing a catalyst element for promoting crystallization of amorphous silicon in such a way that said layer is substantially in intimate contact with top or bottom surface of said silicon film; etching said N- or P-type silicon film and said layer containing said catalyst element to form a pair of semiconductor regions becoming sourcedrain regions; forming a substantially intrinsic amorphous silicon film; forming a dielectric film; and selectively crystallizing said amorphous silicon film by thermal annealing; forming a conductive coating; and etching said conductive coating, said dielectric film, and said silicon film to form a gate electrode, a gate-insulating film, and a semiconductor layer.

An eighth embodiment of the invention is a method of fabricating a semiconductor device, the method comprising the steps of: forming a pair of semiconductor regions out of N- or P-type silicon on a dielectric surface, said semiconductor regions containing a catalyst element for promoting crystallization of amorphous silicon, said semiconductor regions becoming sourcedrain regions; forming a substantially intrinsic amorphous silicon film; forming a dielectric film; selectively crystallizing said amorphous silicon film by thermal annealing; forming a conductive coating; and etching said conductive coating, said dielectric film, and said silicon film to form a gate electrode, a gate-insulating film, and a semiconductor layer.

In the fifth or seventh embodiment described above, in order to form the layer containing the catalyst element, various methods can be utilized. In one method, a solution containing the catalyst element is applied by spin coating or dipping and then the layer is dried. In another method, the catalyst element or its compound is sputtered to form a film. In a further method, gaseous organic nickel is decomposed and deposited by chemical vapor deposition, using heat, light, or plasma. In any method, the thickness of the layer may be determined according to the required amount of the catalyst element. Generally, the concentration of nickel capable of being contained in the silicon film is less than $1 \times 10^{19}$ atoms/cm$^3$ and so the layer of the catalyst element or its compound is extremely thin. Therefore, this layer may not assume the form of a film in practice.

Where the catalyst element or its compound is deposited as a layer by sputtering, the sputtering target can consist of the catalyst element alone. Furthermore, the sputtering target may be made of silicide of the catalyst element.

In the method of applying and drying the solution in order to form the layer of the catalyst element or its compound, the solution can be aqueous solution or a solution of an organic solvent. The catalyst element is contained in the layer. This means that the element is contained as a compound or that the element is simply dispersed.

Where a polar solvent selected from the group consisting of water, alcohols, acids, and ammonia is used as the solvent, the catalyst element compound acting as a solute is typically selected from acetylacetonate compounds of bromide, acetate, oxalate, carbonate, iodide, nitrate, sulfate, formate, and catalyst elements, 4-cyclohexyl butyrate, oxides, and hydroxides.

Where a nonpolar solvent selected from benzene, toluene, xylene, carbon tetrachloride, chloroform, and ether is used, the compound of the catalyst compound is typically selected from acetylacetonate of the catalyst element and 2-ethylhexanoate. Of course, other solvents and solutes may also be employed.

In the description made thus far, the catalyst element has been completely dissolved in the solution. It is not necessary to completely dissolve the catalyst element. In this case, a material such as an emulsion obtained by uniformly dispersing the catalyst element alone or a powdered compound of the catalyst element in a dispersing medium.

The amount of the catalyst element contained in the solution may vary, depending on the kind of the solution. The ratio of the weight of the catalyst element to the weight of the solution is 1 to 200 ppm, preferably 1 to 50 ppm. This value is determined, taking account of the concentration of the catalyst element in the film obtained after completion of the crystallization and the resistance to hydrofluoric acid.

If the catalyst element is directly applied to the amorphous silicon film, using a polar solvent such as water, then the solution will be repelled. Hence, it is impossible to apply the element uniformly. In this case, a thin oxide film having a thickness less than 100 Å is first formed. Then, the solution containing the catalyst element is applied to the thin oxide film. In this way, the solution can be applied uniformly. Strictly, in this case, the oxide film exists between the amorphous silicon film and the layer containing the catalyst element. However, the oxide film is very thin and so diffusion of the catalyst element into the silicon is by no means hindered. This state is herein expressed as follows: "the layer containing the catalyst element is substantially in intimate contact with the silicon film".

If is also advantageous to add a surface active agent to the solution containing the catalyst element. This improves the adhesion to the applied surface and the adsorption property. This surface active agent may be applied to the surface in advance.

The catalyst element can be directly applied to the amorphous silicon film by using a nonpolar solvent such as toluene solution of 2-ethylhexoic nickel as a solution. In this case, if an intimate contact agent as used when resist is applied is previously applied, then the application of the catalyst element can be performed efficiently. However, if the amount of the applied material is excessive, introduction of the catalyst element in the amorphous silicon will be hindered. Therefore, care must be exercised.

A laminate structure in which the gate electrodes of two TFTs (FIG. 6(C)) obtained in this way share one gate interconnect is fabricated, as shown in FIG. 7(B). In particular, a semiconductor layer 80 has the same structure as the gate interconnect, indicated by 76, and extends continuously. More specifically, however, an amorphous region 82 exists between crystallized regions 81 and 83. In this structure, if the gate electrode 76 is turned ON, the source 72 of the first TFT is turned ON, and the source 73 of the second TFT is turned OFF, channels are created in the crystallized regions 81 and 83 of the semiconductor layer 80. However, a relatively sufficient amount of channel is not formed in the amorphous region 82. As a result, the amorphous silicon region 82 prevents drain current 84 flowing out of the first TFT from reaching the second TFT. In consequence, the individual TFTs are separated from each other. Generally, amorphous silicon exhibits resistivity more than ten thousand times as high as resistivity of crystalline silicon (polycrystalline silicon). Therefore, if the spacing between the two TFTs is approximate to the spacing between the source and drain of each TFT, then the interference current is reduced by a factor of more than 10,000.

That is, in the present invention, the interference current can be prevented by increasing the resistances shown in FIG. 8(B). With respect to the first-mentioned problem (i.e., parasitic capacitance on the gate interconnect), capacitance is produced substantially only in crystallized portions close to the source/drain regions, as can be understood from the above description. Hence, the parasitic capacitance can be greatly reduced.

Other objects and features of the invention will appear in the course of the description thereof, which follows.

DESCRIPTION OF THE PREFERRED EMBODIMENTS

EXAMPLE 1

An example of the present invention is now described by referring to FIGS. 1(A)–1(E), 2(A)–2(C), and 3. The fundamental fabrication method according to the invention is illustrated in FIGS. 1(A)–1(E) and 2(A)–2(C). Corning 7059 glass, NH Technoglass NA35, NH Technoglass NA45, or other non-alkali borosilicate glass is preferably used as a substrate 1. First, silicon oxide was deposited as a buffer layer 2 on the glass substrate 1 to a thickness of 1000 to 5000 Å, preferably 1500 to 3000 Å, by sputtering, plasma-assisted CVD, atmospheric CVD, or other well-known film formation techniques.

Then, a substantially intrinsic amorphous silicon film was deposited to a thickness of 1000 to 5000 Å by plasma-assisted CVD, low-pressure CVD (LPCVD), or other well-known film formation techniques. This film may be polycrystalline or micro-crystalline. Subsequently, an N-type impurity find a P-type impurity were introduced by ion doping techniques to form an N-type region 4 and a P-type region 3. Phosphorus was used as the N-type impurity. Boron was employed as the P-type impurity. In particular, a gas (such as phosphine ($PH_3$) or diborane ($B_2H_6$)) containing phosphorus or boron was diluted with hydrogen. A plasma was induced within this gas. The plasma was drawn by a high voltage to accelerate the impurities forming the plasma. The accelerated particles were directed to a sample to be doped.

In the present example, phosphine was first used. The impurity was implanted into the whole surface at an accelerating voltage of 10 to 30 kV. Then, regions for forming N-type regions were coated with photoresist. Using diborane, boron atoms were lodged at an accelerating voltage of 5 to 30 kV. At this time, the dose of the phosphorus atoms was $1 \times 10^{15}$ atoms/$cm^2$. The dose of the boron atoms was $4 \times 10^{15}$ atoms/$cm^2$. The P-type region 3 was doped with both phosphorus and boron. Since the P-type region 3 was more lightly doped with phosphorus than with boron, this region 3 was doped P-type.

Thereafter, the laminate was immersed in aqueous hydrogen peroxide or in a mixture solution of aqueous hydrogen peroxide and ammonia. A thin oxide film was formed on the surface of the silicon film. When the thickness of the oxide film was about 100 Å, satisfactory results were derived. Therefore, this step can be replaced by thermal oxidation conducted at a relatively low temperature of 500° to 600° C. or by photo-oxidation using UV irradiation.

Then, a quite thin (possibly 1 to 20 Å thick) film of a nickel compound (nickel acetate) was formed by spin coating. In the present example, this was formed in the manner described below. First, nickel was added o an acetate solution at a concentration of 10 to 1000 ppm, e.g., 25 ppm. Then, 2 ml of this acetate solution was dripped onto the substrate while rotating it. This state was maintained for 5 minutes to spread the nickel acetate solution uniformly on the substrate surface. Subsequently, a spin-drying step was carried out at an increased rotational speed (2000 rpm) of the substrate for 60 seconds.

The practical concentration of the nickel in the acetate solution was in excess of 1 ppm. The application of the nickel solution was repeated a few or several times. In this way, a nickel acetate layer could be formed on the amorphous silicon film which underwent spin drying. This layer can be similarly formed, using other nickel compound (FIG. 1(A)).

The laminate was dehydrated at 450° C. for 1 hour. Subsequently, the laminate was thermally annealed at 450°–580° C., e.g., 550° C., for 4 hours. As a result, nickel atoms diffused into the N-type region 4 and into the P-type region 3, thus crystallizing them.

Instead of the thermal annealing, irradiation of KrF excimer laser light may be used. That is, the crystallization can be induced by photo-annealing. Furthermore, after the thermal annealing is carried out in the same conditions as the above conditions, photo-annealing may be performed, using excimer laser or the like. Conversely, after effecting photo-annealing, the thermal annealing may be carried out in the same conditions as the above conditions. Moreover, after the thermal annealing is effected under the same conditions as the above conditions, photo-annealing may be carried out, and then the thermal annealing may be again performed under the same conditions. In any case, the photo-annealing is effective in enhancing the crystallinity. However, photo-annealing tends to induce stress and strain. The thermal annealing is effective in alleviating them.

After crystallizing the N-type region 4 and the P-type region 3 in this way, they were etched to form N-type regions 6 and P-type regions 7 which would become source-drain regions. The etching step was so carried out that the cross section assumed a tapered form. Especially, where the N-type regions 6 and the P-type regions 7 are thick (more than 3000 Å thick), it is necessary to form a tapering cross section in order to prevent breakage which would normally be caused by steps. Dry etching is preferably used to form the tapering cross section.

Then, a substantially intrinsic amorphous silicon layer 8 which would become a channel formation region was formed by plasma-assisted CVD or LPCVD to a thickness of 300 to 1000 Å. There exists almost no selectivity ratio between the thickness of the amorphous silicon layer 8 and the thickness of each of the N-type regions 6 and the P-type regions 7 when an etching step would be carried out later. Rather, the N-type regions 6 and the P-type regions 7 could be more easily etched, because they contained nickel. Taking account of these facts, the thickness of the amorphous silicon layer 8 should be set to less than half, preferably less than one fifth, of the thickness of the N-type regions 6 and the P-type regions 7. In the present example, the amorphous silicon layer 8 was formed to a thickness of 500 Å by plasma-assisted CVD. Under this condition, the N-type regions 6 and the P-type regions 7 were totally covered with the amorphous silicon layer 8 (FIG. 1(B)).

Thereafter, the laminate was thermally annealed at 450°–580° C., e.g., 550° C., for 4 hours. As a result, nickel diffused from the N-type regions 6 and from the P-type regions 7 into the amorphous silicon layer 8. Those portions of the amorphous silicon which were located around the regions 6 and 7 were crystallized (region 9 in FIG. 2(A)). Especially, in the portion of the amorphous silicon layer 8 which was located between the source and drain, crystallization progressed laterally. This portion would become a channel in a TFT later. On the other hand, those portions which were remote from the regions 6 and 7 remained amorphous. However, nickel diffused sufficiently also into these uncrystallized portions. As a result, the concentration of nickel in the N-type regions 6 and the P-type regions 7 and the concentration of nickel in the crystallized silicon region 9 were lower than the concentration of nickel in the N-type regions 6 and the P-type regions 7 in the initial state (FIG. 2(A)).

Figure 3:
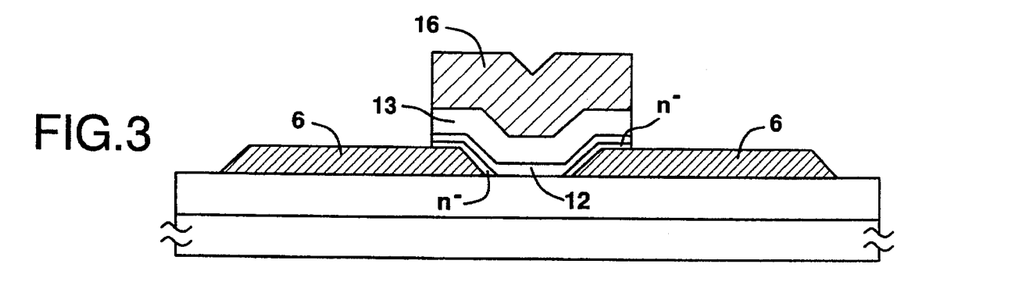
FIG. 3 is a cross-sectional view of a TFT fabricated by Example 1 of a method according to the invention.

During this thermal annealing, the N- and P-type impurities diffused 200–500 Å from the N-type regions 6 and the P-type regions 7 into the substantially intrinsic silicon layer. As shown in FIG. 3, a lightly doped N-type region (n–) and a lightly doped P-type region (p–) were formed. A structure similar to the so-called lightly doped drain (LDD) structure was obtained (FIG. 3).

After this step, a gate-insulating film was formed to a thickness of 500 to 5000 Å by sputtering or plasma-assisted CVD. In the present example, an oxide silicon film 10 was formed to a thickness of 1200 Å by plasma-assisted CVD, using monosilane ($SiH_4$) and dinitrogen monoxide ($N_2O$) as raw materials. Instead of the silicon oxide film, a film of silicon nitride or silicon nitride oxide may be formed. Subsequently, an aluminum film 11 was formed to a thickness of 3000 to 8000 Å, e.g., 5000 Å, by sputtering. Where the aluminum contained 0.1 to 0.5% by weight of scandium (Sc) or yttrium (Y) or 0.5 to 3% by weight of silicon, the heat resistance was improved. Chromium, tantalum, tungsten, molybdenum, or other material may be used instead of the aluminum (FIG. 1(C)).

Figure 2B:
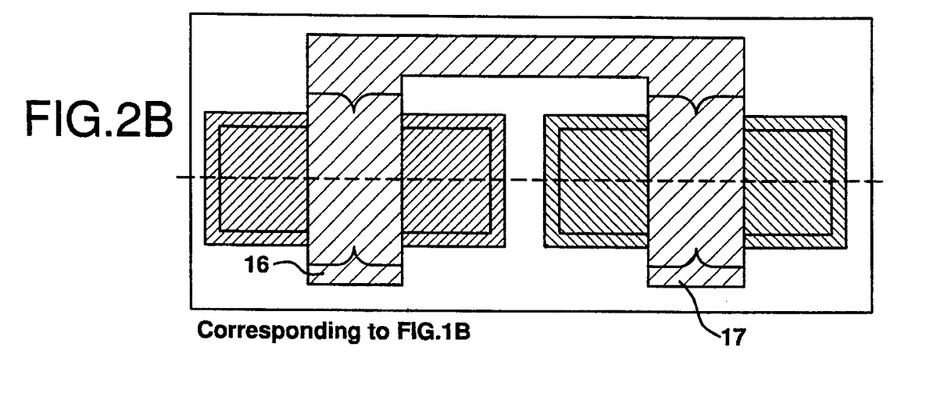
Figure 2C:
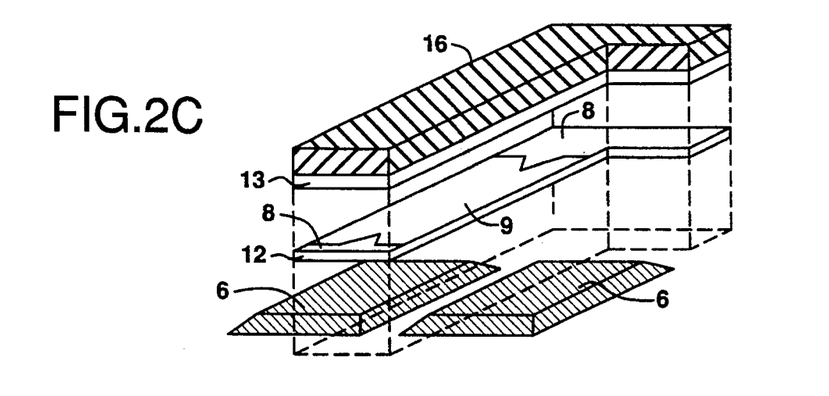
FIG. 2(C) is a perspective view of the lamination structure of the TFTs shown in FIGS. 1(A)–1(E)

Then, the aforementioned aluminum film 11, silicon oxide film 10, and silicon layer 8 were etched to form gate electrodes 16, 17, gate-insulating films 13, 15, and active silicon layers 12 and 14 (FIGS. 1(D) and 2(B)).

Thereafter, an interlayer insulator 18 of silicon oxide was deposited to a thickness of 3000 to 8000 Å, e.g., 5000 Å, by plasma-assisted CVD or other method. Contact holes were formed in the sourcedrain regions 6 and 7. An aluminum film was formed by sputtering to a thickness of 3000 to 8000 Å, e.g., 5000 Å and then etched to form electrodes/interconnects 19, 20, 21. In this way, a TFT circuit was fabricated (FIG. 1(E)).

As can be seen from FIGS. 1(A)–1(E) and 2(A)–2(C), in the present circuit, N-channel and P-channel TFTs share a gate electrode. The circuit assumes a CMOS inverter structure in which the drains of the TFTs are interconnected.

EXAMPLE 2

The present example is now described by referring to FIGS. 4(A)–4(D). Corning 7059 glass was used as a substrate. A silicon oxide was deposited as a buffer layer 32 having a thickness of 2000 Å on the glass substrate 31. Then, an N-type amorphous silicon film was formed to a thickness of 3000 Å by plasma-assisted CVD, using a mixture gas of phosphine ($PH_3$), monosilane ($SiH_4$), and hydrogen ($H_2$).

Subsequently, a nickel layer (not shown) was formed to a thickness of approximately 20 Å by sputtering. The nickel layer was so thin that it might not assume the form of a film in practice.

Under this condition, the amorphous silicon film and the nickel layer were etched to form N-type regions 33 which would become sourcedrain regions. The nickel layer (not shown) overlay the N-type regions.

Then, an intrinsic amorphous silicon layer 34 which would become a channel formation region was formed to a thickness of 800 Å by plasma-assisted CVD. The laminate was thermally annealed at 550° C. for 4 hours. As a result, nickel diffused into the amorphous silicon layer 34 and into the N-type sourcedrain regions 33, thus crystallizing them. Especially, those portions of the silicon layer which were close to the N-type regions were crystallized. Thus, an intrinsic crystalline silicon layer 35 was derived. However, those portions which were remote from the N-type regions 33 were not crystallized but remained amorphous (FIG. 4(A)).

After this step, a silicon oxide film having a thickness of 1200 Å and an aluminum film having a thickness of 5000 Å were deposited. The aluminum film contained 0.1 to 0.5% by weight of scandium (Sc). These films were etched, as well as the silicon layers 34 and 35, to form a gate electrode 40, a gate interconnect 41, gate-insulating films 38, 39, and silicon layers 36, 37. Because of the selectivity of the crystallization, the silicon layer 36 was crystalline but the silicon layer 37 was amorphous. Compared with the gate interconnect 41, the silicon layer 37 is virtually an insulator (FIG. 4(B)).

Then, an electric current was passed through the gate electrode and through the gate interconnect within an electrolytic solution to anodize their surfaces. As a result, anodic oxide coatings (aluminum oxide) 42 and 43 were created. In the present example, ammonia was dripped into 3–10% tartaric acid until a pH of 6.9 to 7.1 was obtained. The produced solution was used as the aforementioned electrolytic solution. The applied voltage was gradually increased up to 120 V, whereupon the voltage was maintained constant. The laminate was then allowed to stand for 1 hour, thus completing anodic oxidation. In the present example, an anodic oxide coating having a thickness of about 2000 Å was obtained. The resulting anodic oxide coating was fine and hard and almost free from pinholes. The withstand voltage was in excess of 50% of the maximum voltage (in the present example, 120 V) used in the anodic oxidation step (FIG. 4(C)).

Thereafter, silicon oxide was deposited as an interlayer insulator 44 having a thickness of 3000 to 8000 Å, e.g., 5000 Å, by plasma-assisted CVD or other method. Contact holes were created in the sourcedrain regions 33. An aluminum film was formed to a thickness of 3000 to 8000 Å, e.g., 5000 Å, by sputtering. The aluminum film was etched to form electrodes and interconnects, 45 and 46. In this way, a TFT circuit was completed (FIG. 4(D)).

Figure 4A:
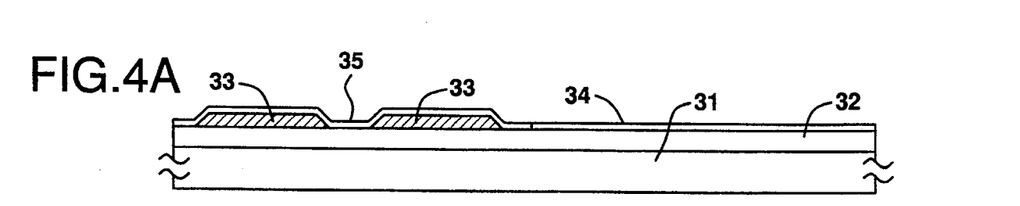
FIGS. 4(A)–4(D) are cross sections illustrating the fabrication sequence of Example 2 of a method according to the invention, for fabricating TFTs.
Figure 4B:
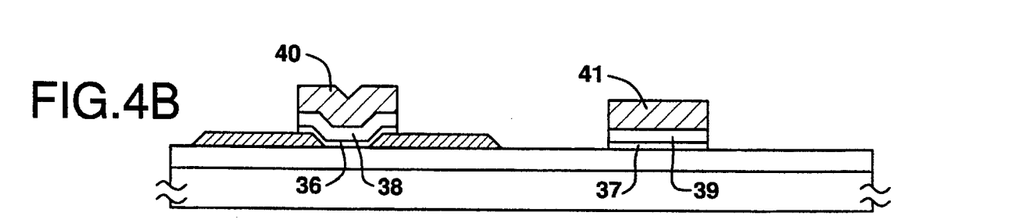
Figure 4C:
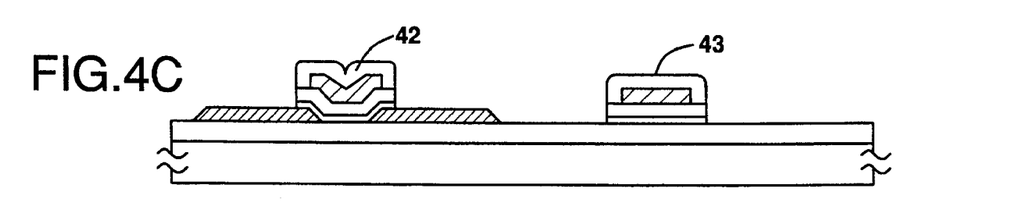
Figure 4D:
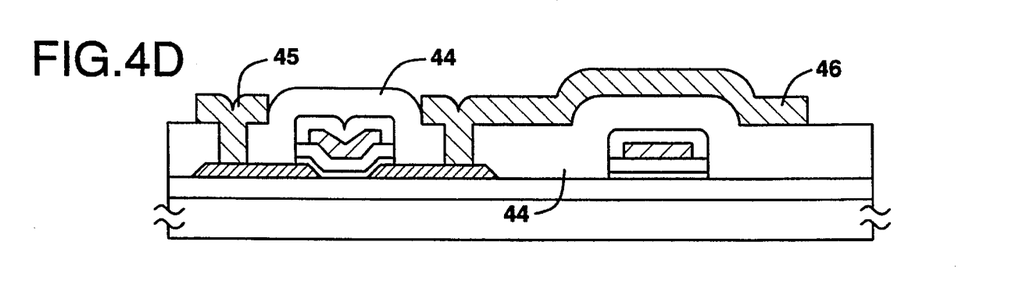

As can be seen from FIG. 4(D), in the present example, the anodic oxide coating 43 existed between the top metallization layer 46 and the gate interconnect 41, as well as the ordinary interlayer insulator 44. This greatly reduced shorts between the adjacent layers.

EXAMPLE 3

The present example relates to a method of fabricating a monolithic active matrix circuit by forming an active matrix circuit and a peripheral driver circuit for driving the active matrix circuit on the same substrate by the same process. The fabrication sequence of the present example is illustrated in FIGS. 9(A)–9(D). Corning 7059 glass was used as the substrate. Silicon oxide was deposited as a buffer layer 92 having a thickness of 2000 Å on the glass substrate, indicated by 91.

An intrinsic amorphous silicon film was formed to a thickness of 3000 Å by plasma-assisted CVD. N-type regions 93 and 95 and a P-type region 94 were formed in the amorphous silicon film by the same means as used in Example 1.

A silicon oxide film 96 having a thickness of 500 Å was selectively formed. In the present example, after depositing the silicon oxide film, it was removed from regions forming the peripheral driver circuit.

Then, the laminate was immersed in a mixture solution of aqueous hydrogen peroxide and ammonia to form a thin silicon oxide film on the surface of the silicon film in the peripheral driver circuit regions not coated with the silicon oxide film. Thereafter, a nickel acetate layer 97 was formed by spin coating under the same conditions as used in Example 1 (FIG. 9(A)).

The laminate was thermally annealed at 550° C. for 4 hours to crystallize the silicon film. However, the portions becoming the active matrix circuit were not crystallized because no nickel existed on these portions. Under this condition, the laminate was etched to form N-type regions 98, 99, 102, 103, and P-type regions 100, 101 which would become sourcedrain regions.

Subsequently, an intrinsic amorphous silicon layer becoming a channel formation region was formed to a thickness of 800 Å by plasma-assisted CVD. The laminate was thermally annealed at 550° C. for 4 hours. As a result, in regions close to the N- and P-type regions 98–101 of the peripheral driver circuit, nickel diffused into the amorphous silicon layer. These regions were crystallized, thus forming a crystalline silicon layer 104. The nickel did not exist on the active matrix circuit regions and so the amorphous silicon layer 105 remained unchanged (FIG. 9(B)).

After this step, a silicon oxide film having a thickness of 1200 Å and an aluminum film having a thickness of 5000 Å were deposited. The aluminum film contained 0.2% by weight of scandium. These films and the silicon layers 104, 105 were etched to form gate electrodes 114, 115, 116, a gate interconnect 117, gate-insulating films 110, 111, 112, 113, and silicon layers 106, 107, 108, 109. Because of the selectivity of the crystallization, the silicon layers 106 and 107 were crystalline silicon but the silicon layers 108 and 109 were amorphous silicon.

Then, the laminate was immersed in an electrolytic solution. An electric current was passed through only the gate interconnects and gate electrodes of the active matrix circuit to anodize their surfaces under the same conditions as used in Example 2. As a result, anodic oxide coatings (aluminum oxide) 118 and 119 were formed. In the present example, the anodic oxide coatings were about 2000 Å thick (FIG. 9(C)).

Thereafter, an interlayer insulator 120 of silicon oxide was formed to a thickness of 5000 Å by plasma-assisted CVD or other method. Contact holes were formed in source-drain regions 98–103. An aluminum film was deposited to a thickness of 5000 Å by sputtering techniques. The aluminum film was etched to form electrodes and interconnects, 121, 122, 123, 124, and 125. Thereafter, silicon nitride was deposited as a passivation film 126 to a thickness of 2000 Å by plasma-assisted CVD. Contact holes were formed in this film. Pixel electrodes 127 of ITO (indium tin oxide) were formed. Thus, a TFT circuit was completed (FIG. 9(D)).

In the present example, the TFTs of the peripheral driver circuit were crystalline silicon TFTs, whereas the TFTs of the active matrix circuit were amorphous silicon TFTs. The anodic oxide coatings were formed only on the gate interconnects of the active matrix circuit in the same way as in Example 2. This is effective in preventing shorts between the adjacent layers because there exist numerous intersections of interconnects in the active matrix circuit.

As described thus far, the present invention can greatly improve the characteristics of edgeless TFTs. However, only quite ordinary equipment, provisions, and method are needed. Furthermore, the inventive method is well suited to mass production. Hence, the invention gives very great merits to the industry.

In the illustrated examples, nickel is used as a catalyst element. Obviously, similar advantages can be had if other catalyst elements such as iron (Fe), cobalt (Co), ruthenium (Ru), rhodium (Rh), palladium (Pd), osmium (Os), iridium (Ir), platinum (Pt), scandium (Sc), titanium (Ti), vanadium (V), chromium (Cr), manganese (Mn), copper (Cu), zinc (Zn), gold (Au), and silver (Ag) are used, though the extent of the advantages may vary, according to the kind of the selected material. In this way, the present invention is industrially quite advantageous.

What is claimed is:

1. A semiconductor device comprising:

source and drain semiconductor regions comprising silicon and having a first conductivity type;

a semiconductor film comprising silicon and having a second conductivity type different from said first conductivity type, said semiconductor film having a first portion as a channel region located between said source and drain semiconductor regions and a second portion not located between said source and drain semiconductor regions:

an insulating film formed on said semiconductor film, wherein said insulating film has peripheral edges substantially aligned with peripheral edges of said semiconductor film; and a lead including a gate electrode formed on said insulating film, wherein said lead has peripheral edges substantially aligned with the peripheral edges of said insulating film wherein said first portion comprises a crystalline semiconductor and said second portion comprises an amorphous semiconductor.

2. The semiconductor device of claim 1 wherein said source and drain semiconductor regions are crystalline.

3. The semiconductor device of claim 1 wherein said semiconductor film is selectively doped with a catalyst metal only in said first portion.

4. The semiconductor device of claim 3 wherein said catalyst metal is selected from the group consisting of Ni, Fe, Co, Ru, Rh, Pd, Os, Ir, Pt, Sc, V, Mn, Cu, Zn, Au and Ag.

5. A semiconductor device comprising:

a pair of semiconductor regions containing an N- or P-type impurity;

a substantially intrinsic semiconductor layer having a first portion located between said semiconductor regions and a second portion not located between said semiconductor regions; and a gate insulating film formed on said substantially intrinsic semiconductor layer wherein said gate insulating film extends substantially coextensively with said substantially intrinsic semiconductor layer;

a gate electrode formed on said gate insulating film wherein said gate electrode extends substantially coextensively with said gate insulating film, wherein said first portion located between said semiconductor regions comprises a crystalline semiconductor and doped with a catalyst element capable of promoting a crystallization of said semiconductor layer while said second portion of the substantially intrinsic semiconductor layer comprises an amorphous semiconductor.

6. The semiconductor device of claim 5 wherein a concentration of said catalyst element in said first portion is from $1\times10^{16}$ to $1\times10^{9}$ atoms/cm$^3$ and a concentration of said catalyst element in said second portion is lower than that in said first portion.

7. A semiconductor device comprising:

a pair of semiconductor regions, each of said semiconductor regions containing an N- or P-type impurity;

a substantially intrinsic semiconductor layer having a first portion located between said pair of semiconductor regions and a second portion not located between said pair of semiconductor regions;.

a gate insulating film formed on said substantially intrinsic semiconductor layer; and a gate electrode formed on said gate insulating film;

wherein said gate insulating film and said gate electrode extend substantially coextensively with said substantially intrinsic semiconductor layer, and said first portion of the semiconductor layer comprises a crystalline semiconductor and functions as a channel region while said second portion comprises an amorphous semiconductor.

8. A semiconductor device having first and second thin film transistors comprising:

first source and drain semiconductor regions comprising silicon and having an N conductivity type;

second source and drain semiconductor regions comprising silicon and having a P conductivity type;

a substantially intrinsic semiconductor film comprising silicon, said semiconductor film having (a) a first portion located between said first source and drain semiconductor regions, (b) a second portion located between said second source and drain semiconductor regions, and (c) a third portion neither located between said first source and drain regions nor said second source and drain semiconductor regions;

an insulating film formed on said substantially intrinsic semiconductor film, wherein said insulating film has peripheral edges substantially aligned with peripheral edges of said substantially intrinsic semiconductor film; and a gate wiring formed on said insulating film, wherein said gate wiring has peripheral edges substantially aligned with the peripheral edges of said insulating film, wherein said first and second portions comprises a crystalline to form a channel region,. respectively, While said third portion comprises an amorphous semiconductor.

9. A semiconductor device having at least first and second thin film transistors, said device comprising:

first source and first drain regions of said first thin film transistor formed on a substrate;

second source and second drain regions of said second thin film transistor formed on said substrate;

a substantially intrinsic semiconductor layer extending between said first source and drain regions and between said second source and drain regions, wherein portions of said semiconductor layer located between said first source and drain regions and between said second source and drain regions function as a channel region, respectively;

a gate insulating layer formed on said substantially intrinsic semiconductor layer; and a gate electrode for both of said first and second thin film transistors, formed over said substantially intrinsic semiconductor layer, said gate electrode being substantially coextensive with said substantially intrinsic semiconductor layer, wherein the channel regions of said first and second thin film transistors are crystalline while portions of said substantially intrinsic semiconductor layer between said channel regions are amorphous.

10. The semiconductor device of claim 9 wherein said first and second source and drain regions contain a catalyst element for promoting a crystallization of silicon.

11. The semiconductor device of claim 10 wherein said catalyst element is contained in said channel regions at a higher concentration than in the portions between said channel regions.

* * * * *